(12) United States Patent
Kidokoro

(10) Patent No.: US 12,381,579 B2
(45) Date of Patent: *Aug. 5, 2025

(54) ERROR RATE MEASUREMENT APPARATUS AND ERROR RATE MEASUREMENT METHOD

(71) Applicant: ANRITSU CORPORATION, Kanagawa (JP)

(72) Inventor: Hisao Kidokoro, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/426,637

(22) Filed: Jan. 30, 2024

(65) Prior Publication Data

US 2024/0322844 A1 Sep. 26, 2024

(30) Foreign Application Priority Data

Mar. 20, 2023 (JP) .................................. 2023-044407

(51) Int. Cl.
*H03M 13/00* (2006.01)
*H03M 13/31* (2006.01)

(52) U.S. Cl.
CPC .................... *H03M 13/31* (2013.01)

(58) Field of Classification Search
None
See application file for complete search history.

(56) References Cited

U.S. PATENT DOCUMENTS

| | | | | |
|---|---|---|---|---|
| 10,142,089 | B2* | 11/2018 | Yao | H03L 7/0807 |
| 11,239,909 | B2* | 2/2022 | Razzell | H04B 10/6166 |
| 11,449,274 | B2* | 9/2022 | Woo | G06F 3/0679 |
| 11,784,716 | B2* | 10/2023 | Kosugi | H04B 10/541 |
| | | | | 398/135 |
| 2018/0278405 | A1* | 9/2018 | Yao | H04L 7/0334 |
| 2021/0013999 | A1* | 1/2021 | Choudhary | H04L 45/121 |
| 2021/0135751 | A1* | 5/2021 | Razzell | H04B 10/6165 |
| 2021/0224215 | A1* | 7/2021 | Das Sharma | G06F 13/4282 |
| 2021/0273745 | A1 | 9/2021 | Tsuyuki et al. | |
| 2022/0012140 | A1* | 1/2022 | Das Sharma | G06F 11/1004 |
| 2022/0188013 | A1* | 6/2022 | Woo | G11C 7/1057 |
| 2022/0236323 | A1* | 7/2022 | Kidokoro | G01R 31/3183 |
| 2022/0283223 | A1* | 9/2022 | Onuma | G01R 31/3177 |
| 2022/0416899 | A1* | 12/2022 | Kosugi | H04B 10/07953 |
| 2023/0308322 | A1* | 9/2023 | Weng | H04L 25/03057 |
| 2024/0125887 | A1* | 4/2024 | Amiri | H04W 64/00 |

FOREIGN PATENT DOCUMENTS

JP 2021-136651 A 9/2021

* cited by examiner

*Primary Examiner* — Mujtaba M Chaudry
(74) *Attorney, Agent, or Firm* — McDonald Hopkins LLC

(57) ABSTRACT

When a PAM4 signal based on bit string data of the Flit pattern is transmitted from a pattern generator 3 to a device under test in a loopback state, an error detection unit 44 of an error detector 4 detects and counts an error in a portion corresponding to the Flit in the PAM4 signal received from the device under test. A Flit error detection unit 45 detects and counts an FEC symbol error in the portion corresponding to the Flit for each ECC Group, and determines an ECC group in which the number of FEC symbol errors exceeds a threshold value, to be the Flit error.

10 Claims, 9 Drawing Sheets

| Number of flits | 1 | 2 | 3 | 4 | 5 | 6 | 7 | 8 | 9 | 10 | 11 | 12 | 13 | 14 | 15 | 16 | 17 | 18 | Total |
|---|---|---|---|---|---|---|---|---|---|---|---|---|---|---|---|---|---|---|---|
| Number of errors in ECC Group 0 | 0 | 1 | 1 | 1 | 2 | 2 | 2 | 3 | 2 | 2 | 3 | 4 | 3 | 2 | 1 | 0 | 0 | 1 | 30 |
| Number of errors in ECC Group 1 | 0 | 0 | 1 | 1 | 1 | 2 | 2 | 2 | 0 | 1 | 2 | 3 | 3 | 3 | 3 | 3 | 3 | 0 | 30 |
| Number of errors in ECC Group 2 | 0 | 1 | 0 | 1 | 1 | 1 | 2 | 2 | 0 | 0 | 1 | 2 | 2 | 2 | 2 | 2 | 0 | 1 | 19 |
| | A | | | | | | B | | | C | | | | | | | | | |
| Number of uncorrectables (2 or more) | 0 | 0 | 0 | 0 | 1 | 1 | 1 | 1 | 1 | 1 | 1 | 1 | 1 | 1 | 1 | 1 | 1 | 0 | 13 |
| FEC Symbol error 0 in flit | 1 | 0 | 0 | 0 | 0 | 0 | 0 | 0 | 0 | 0 | 0 | 0 | 0 | 0 | 0 | 0 | 0 | 0 | 1 |
| FEC Symbol error 1 in flit | 0 | 0 | 0 | 0 | 0 | 0 | 0 | 0 | 0 | 0 | 0 | 0 | 0 | 0 | 0 | 0 | 0 | 0 | 1 |
| FEC Symbol error 2 in flit | 0 | 0 | 0 | 1 | 0 | 0 | 0 | 0 | 1 | 0 | 0 | 0 | 0 | 0 | 0 | 0 | 0 | 1 | 3 |
| FEC Symbol error 3 in flit | 0 | 0 | 0 | 0 | 0 | 0 | 0 | 0 | 0 | 1 | 0 | 0 | 0 | 0 | 0 | 0 | 1 | 0 | 3 |
| FEC Symbol error 4 in flit | 0 | 0 | 0 | 0 | 1 | 0 | 0 | 0 | 0 | 0 | 0 | 0 | 0 | 0 | 0 | 0 | 0 | 0 | 1 |
| FEC Symbol error 5 in flit | 0 | 0 | 0 | 0 | 0 | 1 | 0 | 0 | 0 | 0 | 0 | 0 | 0 | 0 | 0 | 0 | 0 | 0 | 2 |
| FEC Symbol error 6 in flit | 0 | 0 | 0 | 0 | 0 | 0 | 1 | 0 | 0 | 0 | 1 | 0 | 0 | 0 | 0 | 0 | 0 | 0 | 3 |
| FEC Symbol error 7 in flit | 0 | 0 | 0 | 0 | 0 | 0 | 0 | 1 | 0 | 0 | 0 | 0 | 0 | 1 | 0 | 0 | 0 | 0 | 2 |
| FEC Symbol error 8 or more in flit | 0 | 0 | 0 | 0 | 0 | 0 | 0 | 0 | 0 | 0 | 0 | 1 | 1 | 0 | 0 | 0 | 0 | 0 | 2 |

FIG. 4

ERROR RATE MEASUREMENT APPARATUS AND ERROR RATE MEASUREMENT METHOD

TECHNICAL FIELD

The present invention relates to an error rate measurement apparatus and an error rate measurement method for using a device that transitions to a loopback state by link training as a device under test and measuring an error of a PAM4 signal based on bit string data of a Flit pattern returned and transmitted from the device under test in the loopback state.

BACKGROUND ART

An error rate measurement apparatus is hitherto known as an apparatus that transmits a test signal of a known pattern including fixed data to a device under test and compares a signal under test returned and received from the device under test in compliance with the transmission of the test signal with a reference signal to be a reference in units of bits to measure a bit error rate (BER).

Further, as disclosed in Patent Document 1 below, an error rate measurement apparatus having an RS-FEC measurement function compliant with the IEEE 802.3 standard is known. This error rate measurement apparatus aggregates the number of FEC symbol errors for each codeword length in a region divided by the codeword length, and acquires and displays each error count value and error rate.

By the way, the physical layer evaluation of PCI Express 5.0 is performed by performing link training with the link training and status state machine (LTSSM) of the device under test to put the device under test in the loopback state (signal return state), and then using a modified compliance pattern (MCP). The performance index at this time is $BER<10^{-12}$.

RELATED ART DOCUMENT

Patent Document

[Patent Document 1] JP-A-2021-136651

DISCLOSURE OF THE INVENTION

Problem that the Invention is to Solve

FEC is introduced in PCI Express 6.0. However, although the MCP is also defined in PCI Express 6.0, the MCP is not a target of an FEC guard. Therefore, in a case where Gen6 physical layer evaluation is intended to be performed with an FEC-guarded Flit pattern, the Flit pattern does not include an electrical idle exit ordered set (EIEOS) required for 1b/1b synchronization. Since the EIEOS is not included, synchronization of PCIe Gen6 physical layer is not possible.

More specifically, Gen6 Flit of PCI Express 6.0 is 1b/1b encoded. In 1b/1b encoding, the EIEOS is used for 1b/1b synchronization. If only a pattern flowing in the L0 state flows from the error rate measurement apparatus to the device under test, the pattern in L0 includes only Flit, SDS, SKP ordered sets (SKP OS) as illustrated in FIG. 5B. Thus, there are problems that it is not possible for the error rate measurement apparatus to receive the EIEOS from the device under test, it is not possible to achieve 1b/1b synchronization in the PCIE Gen6.0 physical layer, and error measurement is not possible.

The L0 state in which Flit is normally transmitted and received is a state that is reached after synchronization of 1b/1b symbols by the EIEOS has been completed, and the EIEOS is not transmitted or received. When the EIEOS flows in the L0 state, a transition occurs to the Recovery state.

Therefore, the present invention has been made in view of the above problems, and an object of the present invention is to provide an error rate measurement apparatus and an error rate measurement method for simultaneously measuring not only a bit error but also a Flit error.

Means for Solving the Problem

In order to achieve the above object, according to a first aspect of the present invention, an error rate measurement apparatus includes an operation unit 2 that performs a setting, and an error detector 4 that receives a pulse amplitude modulation 4 (PAM4) signal based on bit string data of a Flit pattern transmitted from a device under test W and that detects an error, in which the operation unit sets one period of the Flit pattern including an electrical idle exit ordered set (EIEOS) according to the number of lanes defined in a high-speed bus standard, and a skip ordered set (SKP OS), a Flit length according to the number of lanes, a threshold value for determining a Flit error, an insertion period of the EIEOS, a pattern leading of the Flit pattern, and a synchronization condition threshold value, the error rate measurement apparatus further includes a pattern generator 3 that generates the PAM4 signal based on bit string data of the Flit pattern and transmits the generated PAM4 signal to the device under test in a loopback state, and the error detector includes an error detection unit 44 that detects and counts an error in a portion corresponding to Flit by excluding, from a measurement target, a portion corresponding to the EIEOS and the SKP OS in the PAM4 signal received from the device under test in the loopback state, a Flit error detection unit 45 that detects a forward error correction (FEC) symbol error in the portion corresponding to the Flit for each error correction code (ECC) group, counts the number of FEC symbol errors, and determines an ECC group in which the number of FEC symbol errors exceeds the threshold value, to be the Flit error, and a synchronization state management unit 46 that gives an instruction to reacquire the pattern leading of the Flit pattern when an amount of the error in the portion corresponding to the Flit, which is detected by the error detection unit, exceeds the synchronization condition threshold value.

According to a second aspect of the present invention, the error rate measurement apparatus in the first aspect, in which, when the portion corresponding to the SKP OS is excluded from the measurement target, the operation unit selects and sets whether to mask a bit error in the corresponding portion or to filter and remove the SKP OS itself.

According to a third aspect of the present invention, the error rate measurement apparatus in the first aspect further includes a selection unit that selects and sets whether or not to decode the portion corresponding to the Flit according to the high-speed bus standard.

According to a fourth aspect of the present invention, in the error rate measurement apparatus in any one of the first to third aspects, link training is performed with the device under test, and a link training and status state machine (LTSSM) of the device under test is transitioned to the loopback state.

According to a fifth aspect of the present invention, an error rate measurement apparatus includes an operation unit 2 that performs a setting, and an error detector 4 that receives a pulse amplitude modulation 4 (PAM4) signal based on bit string data of a Flit pattern transmitted from a device under test W and that detects an error, in which the operation unit sets one period of the Flit pattern including an electrical idle exit ordered set (EIEOS) according to the number of lanes defined in a high-speed bus standard, and a skip ordered set (SKP OS), a Flit length according to the number of lanes, a threshold value for determining a Flit error, an insertion period of the EIEOS, a pattern leading of the Flit pattern, and a synchronization condition threshold value, the error rate measurement apparatus further includes a pattern generator 3 that generates the PAM4 signal based on bit string data of the Flit pattern and transmits the generated PAM4 signal to the device under test in a loopback state, the error detector includes an error detection unit 44 that detects and counts an error in a portion corresponding to Flit by excluding, from a measurement target, a portion corresponding to the EIEOS and the SKP OS in the PAM4 signal received from the device under test in the loopback state, a Flit error detection unit 45 that detects a forward error correction (FEC) symbol error in the portion corresponding to the Flit for each error correction code (ECC) group, counts the number of FEC symbol errors, and determines an ECC group in which the number of FEC symbol errors exceeds the threshold value, to be the Flit error, and a synchronization state management unit 46 that gives an instruction to reacquire the pattern leading of the Flit pattern when an amount of the error in the portion corresponding to the Flit, which is detected by the error detection unit, exceeds the synchronization condition threshold value, when a portion corresponding to the SKP OS is excluded from the measurement target, the operation unit selects and sets whether to mask a bit error in the corresponding portion or to filter and remove the SKP OS itself, the error rate measurement apparatus further includes a selection unit that selects and sets whether or not to decode a portion corresponding to the Flit according to the high-speed bus standard, link training is performed with the device under test, and a link training and status state machine (LTSSM) of the device under test is transitioned to the loopback state.

According to a sixth aspect of the present invention, there is provided an error rate measurement method using an operation unit 2 that performs a setting, and an error detector 4 that receives a pulse amplitude modulation 4 (PAM4) signal based on bit string data of a Flit pattern transmitted from a device under test W and that detects an error, in which, in a step of, by the operation unit, performing the setting, one period of the Flit pattern including an electrical idle exit ordered set (EIEOS) according to the number of lanes defined in a high-speed bus standard, and a skip ordered set (SKP OS), a Flit length according to the number of lanes, a threshold value for determining a Flit error, an insertion period of the EIEOS, a pattern leading of the Flit pattern, and a synchronization condition threshold value are set, the error rate measurement method includes a step of, by a pattern generator 3, generating the PAM4 signal based on bit string data of the Flit pattern and transmitting the generated PAM4 signal to the device under test in a loopback state, a step of, by an error detection unit 44 of the error detector, detecting and counting an error in a portion corresponding to Flit by excluding, from a measurement target, a portion corresponding to the EIEOS and the SKP OS in the PAM4 signal received from the device under test in the loopback state, a step of, by a Flit error detection unit 45 of the error detector, detecting a forward error correction (FEC) symbol error in the portion corresponding to the Flit for each error correction code (ECC) group, counting the number of FEC symbol errors, and determining an ECC group in which the number of FEC symbol errors exceeds the threshold value, to be the Flit error, and a step of, by a synchronization state management unit 46 of the error detector, giving an instruction to reacquire the pattern leading of the Flit pattern when an amount of in the portion corresponding to the Flit, which is detected by the error detection unit, exceeds the synchronization condition threshold value.

According to a seventh aspect of the present invention, the error rate measurement method in the sixth aspect further includes a step of, by the operation unit, selecting and setting whether to mask a bit error in the corresponding portion or to filter and remove the SKP OS itself, when the portion corresponding to the SKP OS is excluded from the measurement target.

According to an eighth aspect of the present invention, the error rate measurement method in the sixth aspect further includes a step of, by a selection unit, selecting and setting whether or not to decode the portion corresponding to the Flit according to the high-speed bus standard.

According to a ninth aspect of the present invention, the error rate measurement method in any one of the sixth to eighth aspects further includes a step of performing link training with the device under test, and causing a link training and status state machine (LTSSM) of the device under test to transition to the loopback state.

According to a tenth aspect of the present invention, there is provided an error rate measurement method using an operation unit 2 that performs a setting, and an error detector 4 that receives a pulse amplitude modulation 4 (PAM4) signal based on bit string data of a Flit pattern transmitted from a device under test W and that detects an error, in which, in a step of, by the operation unit, performing the setting, one period of the Flit pattern including an electrical idle exit ordered set (EIEOS) according to the number of lanes defined in a high-speed bus standard, and a skip ordered set (SKP OS), a Flit length according to the number of lanes, a threshold value for determining a Flit error, an insertion period of the EIEOS, a pattern leading of the Flit pattern, and a synchronization condition threshold value are set, the error rate measurement method includes a step of, by a pattern generator 3, generating the PAM4 signal based on bit string data of the Flit pattern and transmitting the generated PAM4 signal to the device under test in a loopback state, a step of, by an error detection unit 44 of the error detector, detecting and counting an error in a portion corresponding to Flit by excluding, from a measurement target, a portion corresponding to the EIEOS and the SKP OS in the PAM4 signal received from the device under test in the loopback state, a step of, by a Flit error detection unit 45 of the error detector, detecting a forward error correction (FEC) symbol error in the portion corresponding to the Flit for each error correction code (ECC) group, counting the number of FEC symbol errors, and determining an ECC group in which the number of FEC symbol errors exceeds the threshold value, to be the Flit error, a step of, by a synchronization state management unit 46 of the error detector, giving an instruction to reacquire the pattern leading of the Flit pattern when an amount of the error in the portion corresponding to the Flit, which is detected by the error detection unit, exceeds the synchronization condition threshold value, a step of, by the operation unit, selecting and setting whether to mask a bit error in the corresponding portion or to filter and remove the SKP OS itself, when a portion corresponding to the SKP OS is excluded from the measurement target, a step of, by a selection unit, selecting and setting whether or not to decode a portion corresponding to the Flit according to the high-speed bus standard, and a step of performing link training with the device under test, and causing a link training and status state machine (LTSSM) of the device under test to transition to the loopback state.

Advantage of the Invention

According to the present invention, it is possible to use the same Flit pattern as in the L0 state without bringing a device under test into the L0 state, and to accurately ascertain the relationship between a bit error and a Flit error. Further, even in an environment where patterns guarded by FEC and patterns not guarded by FEC are present together, it is possible to identify the pattern guarded by FEC and determine whether the pattern is Uncorrectable.

BRIEF DESCRIPTION OF THE DRAWINGS

FIG. 4 is a diagram illustrating an example of the number of Flit errors for each ECC group and the number of Flits for each of the number of FEC symbol errors in Flit.

BEST MODE FOR CARRYING OUT THE INVENTION

Hereinafter, embodiments for implementing the present invention will be described in detail with reference to the accompanying drawings.

Figure 1:
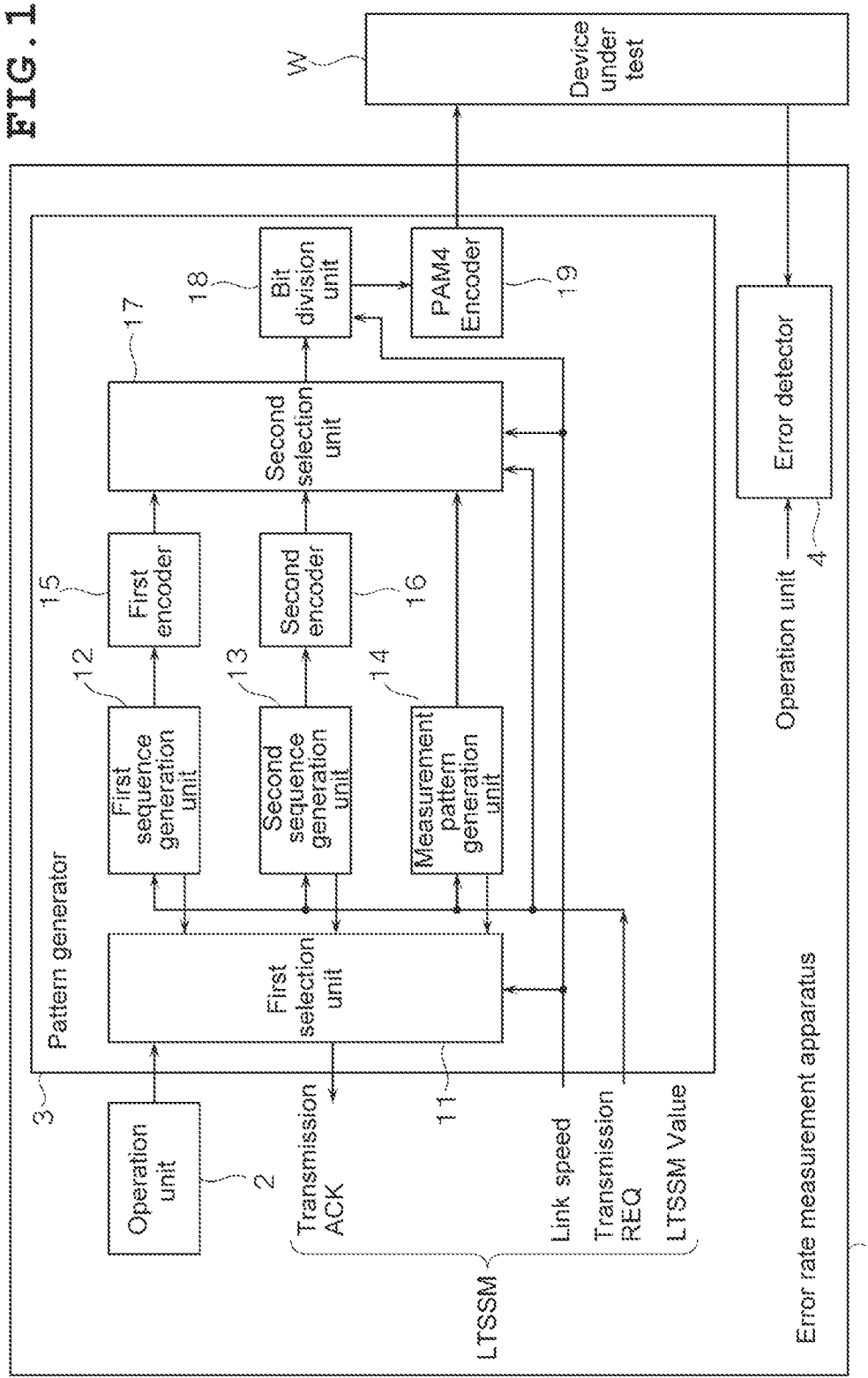
FIG. 1 is a block diagram illustrating a schematic configuration of an error rate measurement apparatus according to the present invention.

As illustrated in FIG. 1, an error rate measurement apparatus 1 in the present embodiment uses, as a device under test (DUT) W, a device that transitions to a loopback state by link training and has a function of simultaneously measuring not only a bit error by using a Flit pattern, but also a Flit error (whether FEC of Flit becomes Uncorrectable) in physical layer error measurement of the PCI Express 6.0 (referred to as PCIe Gen6 below) standard as a high-speed bus standard. The error rate measurement apparatus 1 is schematically configured to include an operation unit 2, a pattern generator 3, and an error detector 4.

Note that, in the PCIE Gen6 standard, which is the target of the present embodiment, a signal to be handled is a PAM4 signal. Furthermore, although the concept of Flit is defined from PCIe Gen6, the present invention can also be applied to future PCI Express standards that use the similar concept of Flit. Further, in the present embodiment, PCIe Gen6 will be described as an example, but the present invention can also be applied to a case where a Flit error is measured in other high-speed bus standards such as the USB.

[Regarding Flit]

First, Flit defined in the PCIe Gen6 standard handled by the error rate measurement apparatus 1 in the present embodiment will be described with reference to FIGS. 3 and 4. Flit is a data format that is transmitted when the state of a link training and status state machine (LTSSM) is L0 in the PCIe Gen6 standard, and has an error correction function using FEC.

Figure 3:
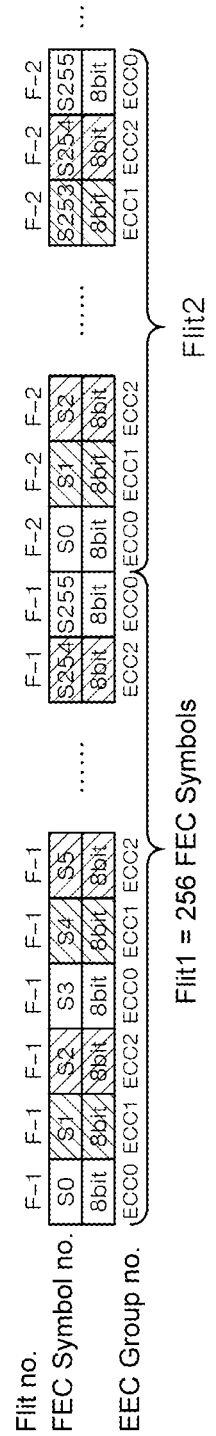
FIG. 3 is an explanatory diagram of Flit defined in the PCI Express 6.0 standard.

As illustrated in FIG. 3, one Flit is interleaved with three ECC Groups (ECC Group 0, ECC Group 1, and ECC Group 2). One ECC Group is divided by one FEC symbol (4 PAM4 symbols=8 bits).

To summarize the conditions under which a Flit becomes Uncorrectable, it becomes Uncorrectable when an FEC symbol error occurs twice in the same ECC Group in one Flit.

This will be further described with reference to FIG. 4. FIG. 4 illustrates an example of the number of errors in Flit for each ECC Group, the number (2 or more) of Uncorrectables, and the number (0 to 7, 8 or more) of Flits for each of the number of FEC symbol errors in a Flit. Note that, in FIG. 4, the portion indicated by diagonal lines downward to the right indicates a portion that is Uncorrectable, and the portion indicated by diagonal line upward to the right indicates a portion which may or may not be Uncorrectable.

For example, a case where FEC symbol error threshold value: n≥2 will be described as an example with reference to FIG. 4. In A (number of Flits: 3) surrounded by the dotted line in FIG. 4, two FEC symbol errors have occurred in the Flit, but the number of errors in other ECC Groups (in this case, ECC Group 0 and ECC Group 1) is 1, so it is not Uncorrectable.

On the other hand, in B (number of Flits: 5) surrounded by the dotted line in FIG. 4, not only four FEC symbol errors have occurred in the Flit, but also the number of errors in any ECC group (in this case, ECC Group 0) is two even in view of the number of errors for each ECC Group, so it becomes Uncorrectable.

In addition, in C (number of Flits: 9) surrounded by the dotted line in FIG. 4, two FEC symbol errors have occurred in the Flit, and the number of errors in the same ECC Group (in this case, ECC Group 0) is two, so it becomes Uncorrectable.

As described above, in PCIe Gen6, a new Flit mode is introduced, and the Flit has a length of 256 FEC symbols (1 FEC symbol=8 bits) and has an error correction function using FEC. Furthermore, since Gen6 Flit is 1b/1b encoded, one FEC symbol=1b/1b symbol. FEC of the Flit is a 3-way interleaved ECC, and each ECC Group can correct a single byte error (one FEC symbol error).

In one Flit, errors up to three FEC symbols can be corrected. In a case where the error correction is not possible, a Flit error (ECC is Uncorrectable) occurs. However, even three FEC symbol errors may be uncorrectable depending on the occurrence situation of the error position. For example, in a case where Symbol 0 of ECC Group 0, Symbol 1 of ECC Group 1, and Symbol 2 of ECC Group 2 are errors, such errors can be corrected, but, in a case where Symbols 0, 3, and 6 of the same ECC Group 0 are errors, such errors are uncorrectable. This means that even if the bit error rate is the same, the number of Flit errors occurring differs depending on the position where the bit error occurs.

Regarding Overview of Present Invention

Figure 5A:
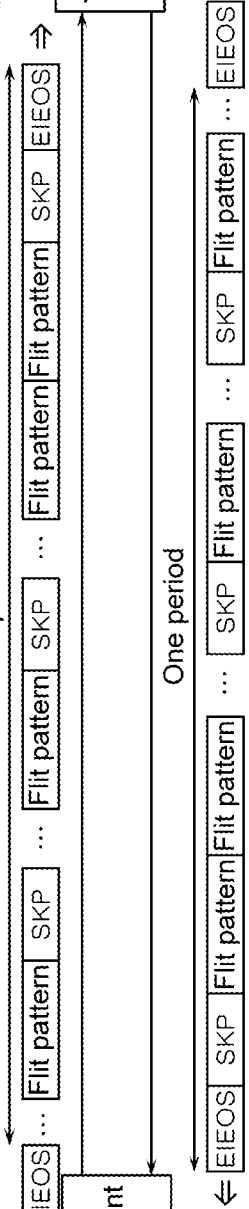
FIG. 5A is a schematic explanatory diagram of an error measurement method using the error rate measurement apparatus according to the present invention.
Figure 5B:
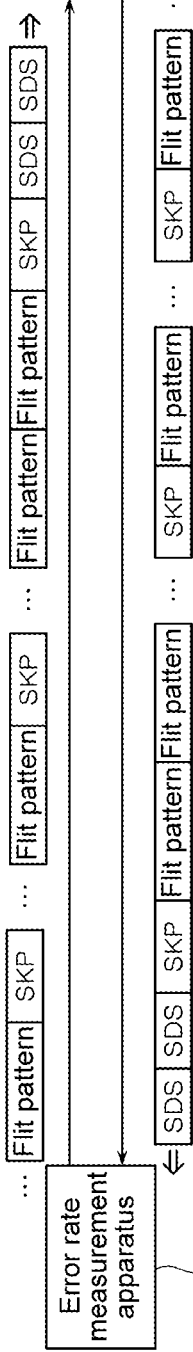
FIG. 5B is a schematic explanatory diagram of an error measurement method using a conventional error rate measurement apparatus.

As illustrated in FIG. 5A, the error rate measurement apparatus 1 uses a Flit pattern in which an EIEOS is periodically inserted as a pattern to be transmitted after putting the device under test W into a loopback state by link training, and simultaneously measures errors (bit error, PAM4 symbol error, FEC symbol error) and a Flit error. At this time, the pattern at a SKP ordered sets (abbreviated as SKP below: indicated as "SKP" in the drawings) position is masked, and the pattern at the EIEOS position is also masked to exclude the pattern from the measurement target, and the error only in the Flit portion (bit error, PAM4 symbol error, FEC symbol error) is counted. Furthermore, for the Flit portion, FEC symbol errors are counted for each ECC Group, and an ECC group in which the number of FEC symbol errors exceeds an FEC symbol error threshold value is determined to be a Flit error.

In performing the above error measurement, regarding a method of excluding a portion corresponding to the SKP from the measurement target, the operation unit 2 is enabled to select two of a method of masking a bit error in the corresponding portion and a method of filtering and removing the SKP itself. Further, regarding the portion corresponding to Flit, the operation unit 2 is enabled to select whether or not to perform decoding in PCIe Gen6, and is enabled to check an occurrence of an error depending on whether or not decoding is performed.

Note that the influence of inserting the EIEOS can be almost ignored by setting the lengths of the Flit and SKP portions to be sufficiently longer than the EIEOS length. An EIEOS insertion period, that is, the pattern length L [bit] is determined as follows.

A SKP insertion interval t[Flit] is defined by the PCIe Gen6 standard. Furthermore, since Flit is scrambled by LESR: $G(X)=X23+X21+X16+X8+X5+X2+1$, the EIEOS period is secured to be longer than a length of $LFSR\_L=2^{23}-1=8{,}388{,}607$ [bit]. If the value is less than such a length, values that do not appear in the scramble value appear.

Therefore, the least common multiple LCM_LFSR_Flit of the scramble length LFSR_L [bit] and the Flit length Flit_L [bit] is calculated (Expression (1) below).

$$LCM(LFSR\_L, Flit\_L) = LCM\_LFSR\_Flit \qquad \text{Expression (1)}$$

From this, LCM Flit [Flit] that is the number of Flits that reach LCM is expressed as in Expression (2) as follows.

$$LCM\_Flit = LCM\_LFSR\_Flit/Flit\_L \qquad \text{Expression (2)}$$

Then, LCM_skp_t that is the number of SKPs (rounded up to an integer) that is equal to or more than LFSR is expressed as in Expression (3) as follows. Here, ceil ( ) represents a positive number rounded up to the nearest whole number.

$$LCM\_skp\_t = \text{ceil}(LCM\_Flit/t) \qquad \text{Expression (3)}$$

Further, Flit_lfsr_t [Flit] that is the number of Flits that rotates the LFSR one period or more can be obtained by Expression (4) as follows.

$$Flit\_lfsr\_t = t \times LCM\_skp\_t \qquad \text{Expression (4)}$$

Here, since it is necessary to insert SKP periodically, when one pair of Flit and SKP is set as Flit_size [bit] that is the Flit period length, Flit_size [bit] is expressed as in Expression (5) as follows.

$$Flit\_size \ [bit] = SKP\_L + t \times Flit\_L \qquad \text{Expression (5)}$$

Note that SKP_L is the pattern length [bit] of SKP.
Therefore, the pattern length L [bit] can be obtained by Expression (6) as follows.

$$L[bit] = \qquad \text{Expression (6)}$$
$$EIEOS \ \text{length} \ [bit] + (LCM\_skp\_t \times Flit\_size) \times n[bit]$$
$$(n = \text{integer of 1 or more})...$$

The number of Flits included in this pattern length L [bit] is expressed by Expression (4)×n.

Then, the EIEOS length is 128 bits, and, if n is set large, the EIEOS at the pattern length L [bit] can be almost ignored.

In the PCIe Gen6 standard, even if the physical layer satisfies a bit error performance index, the Flit error may occur depending on stress conditions. On the other hand, by simultaneously measuring the bit error and the Flit error, it is possible to clarify the correlation between the bit error and the Flit error, and to know whether or not the Flit error occurs.

In addition, Flit carries the user data of the Transaction Layer. When a Flit error occurs, the user data is recovered by retransmitting Flit. However, if this occurs frequently, communication is not possible in the original PCIe Gen6 band. On the other hand, by simultaneously performing bit error measurement and Flit error measurement, it becomes possible to accurately ascertain the throughput performance when the user data is used, that is, ascertain whether or not the original PCIe Gen6 band can be used.

[Regarding Configuration of Each Unit in Error Rate Measurement Apparatus]

The operation unit 2 also functions as setting means and display means. The operation unit 2 includes, for example, operation knobs, various keys, switches, buttons, and a user interface such as soft keys on a display screen of the display means, which are provided on the body of the error rate measurement apparatus 1 illustrated in FIG. 1. The operation unit 2 performs various settings, instructions, and display of measurement results according to user operations.

Setting contents set by the operation unit 2 include settings of one period of the Flit pattern (including the EIEOS and the SKP) according to the number of lanes, a Flit length according to the number of lanes, a mask pattern length for masking the portion corresponding to the SKP, a mask pattern period corresponding to a repetition period of the SKP, a threshold value for determining the Flit error, a mask pattern length for masking the portion corresponding to the EIEOS, an insertion period of the EIEOS, and a pattern leading of the Flit pattern. In addition, as the method of excluding the SKP from the measurement target, the operation unit 2 is enabled to select either of the method of masking the bit error in the corresponding portion and the method of filtering and removing the SKP itself, and is enabled to select either of no-decoding in PCIe Gen6 and decoding in PCIe Gen6 for the Flit portion.

The pattern generator 3 generates a Flit error measurement pattern in accordance with an instruction from the operation unit 2. Thus, as illustrated in FIG. 1, the pattern generator 3 is configured to include a first selection unit 11, a first sequence generation unit 12, a second sequence generation unit 13, a measurement pattern generation unit 14, a first encoder 15, a second encoder 16, a second selection unit 17, a bit division unit 18, and a PAM4 encoder 19.

The first selection unit 11 selects any one of transmission completion signals from the first sequence generation unit 12, the second sequence generation unit 13, and the measurement pattern generation unit 14 according to a Link Speed, and outputs the selected transmission completion signal to an LTSSM 36.

The first sequence generation unit 12 selectively generates a training sequence (TSx OS) such as TS1, TS2, EIEOS, and SKP used in PCIe Gen1-2, and a training sequence (TSx OS) such as TS1, TS2, EIEOS, and SKP used in PCIe Gen3-5.

The second sequence generation unit 13 generates a training sequence (TSx OS) such as TS0, TS1, TS2, EIEOS, and SKP used in PCIe Gen6.

The measurement pattern generation unit 14 generates a Flit pattern (a pattern (including EIEOS and SKP) calculated by Expression (6)) according to the number of lanes set by the operation unit 2, as a pattern that is the base of the Flit error measurement pattern to be transmitted to the device under test W.

The first encoder 15 includes an 8b/10b encoder and a 128b/130b encoder. The 8b/10b encoder performs 8b/10b encoding used in PCIe Gen1-2 on the training sequence generated by the first sequence generation unit 12. Further, the 128b/130b encoder performs 128b/130b encoding used in PCIe Gen3-5 on the training sequence generated by the first sequence generation unit 12.

The second encoder 16 performs 1b/1b encoding used in PCIe Gen6 on the training sequence generated by the second sequence generation unit 13.

The second selection unit 17 selects any of pieces of output data of the measurement pattern generation unit 14, the first encoder 15, and the second encoder 16 according to the LTSSM state from the LTSSM 36 and the Link Speed.

The bit division unit 18 divides an input signal into the most significant bit string data (referred to as MSB data below) and the least significant bit string data (referred to as LSB data below) according to the Link Speed instructed by the LTSSM 36. Note that signals having the same MSB data and LSB data are output to become NRZ in PCIe Gen1-5, and, in PCIe Gen6, an input signal is bit-interleaved and output as MSB data and LSB data so that a PAM4 signal is obtained.

The PAM4 encoder 19 performs PAM4 encoding on the MSB data and LSB data divided by the bit division unit 18, and outputs a PAM4 signal obtained by performing PAM4 encoding, as the Flit error measurement pattern.

Figure 2:
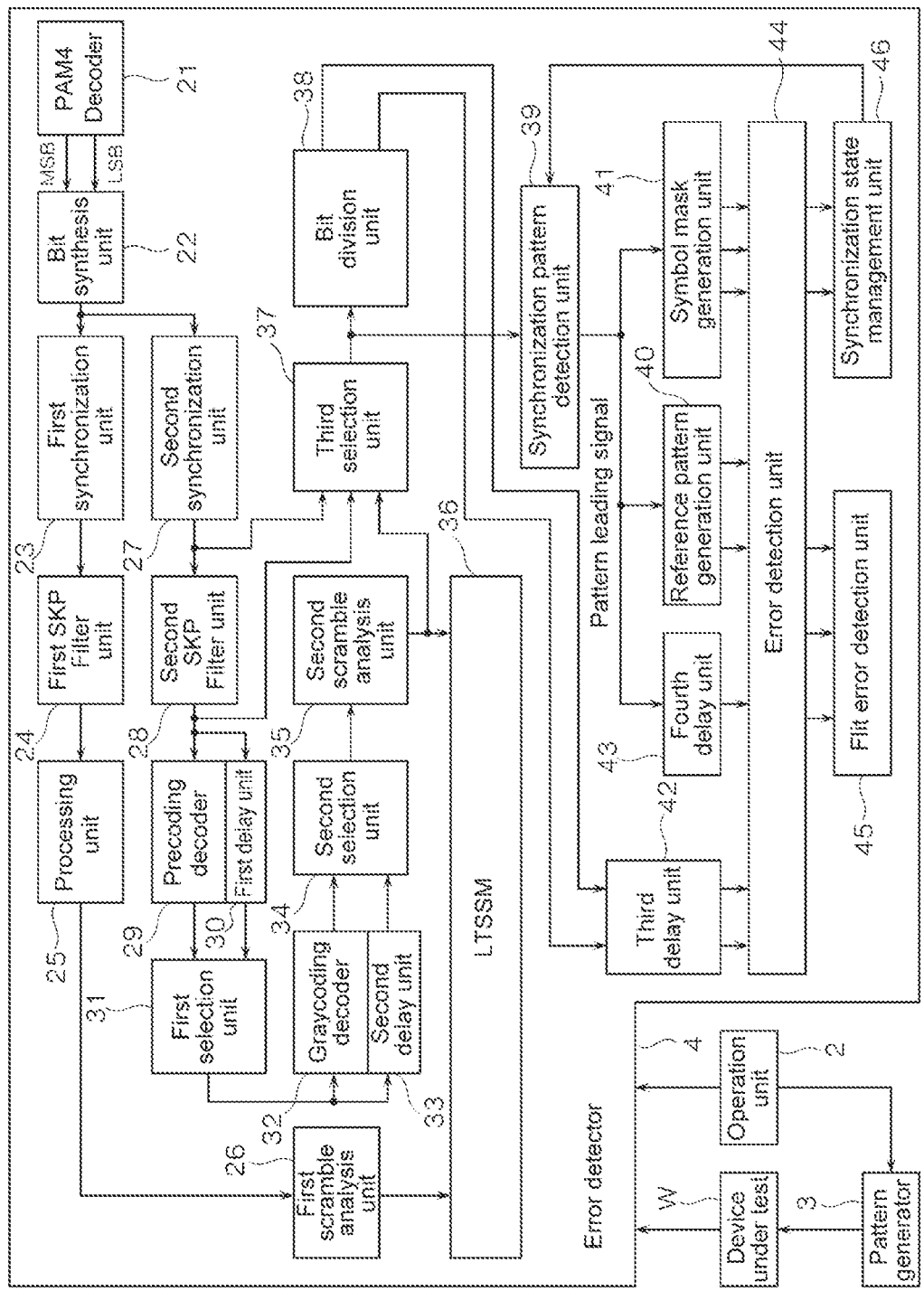
FIG. 2 is a block diagram illustrating an internal configuration of an error detector in FIG. 1.

When the Flit error measurement pattern (PAM4 signal) is transmitted from the pattern generator 3 to the device under test W, the error detector 4 receives a Flit error measurement pattern (PAM4 signal) returned from the device under test W transitioned to the loopback state by link training, and detects an error. Thus, as illustrated in FIG. 2, the error detector 4 is configured to include a PAM4 decoder 21, a bit synthesis unit 22, a first synchronization unit 23, a first SKP filter unit 24, a processing unit 25, a first scramble analysis unit 26, a second synchronization unit 27, a second SKP filter unit 28, a Precoding decoder 29, a first delay unit 30, a first selection unit 31, a Graycoding decoder 32, a second delay unit 33, a second selection unit 34, a second scramble analysis unit 35, the LTSSM 36, a third selection unit 37, a bit division unit 38, a synchronization pattern detection unit 39, a reference pattern generation unit 40, a symbol mask generation unit 41, a third delay unit 42, a fourth delay unit 43, an error detection unit 44, a Flit error detection unit 45, and a synchronization state management unit 46.

The PAM4 decoder 21 decodes and separates the PAM4 symbol of the Flit error measurement pattern (PAM4 signal) received from the device under test W into MSB data and LSB data.

The bit synthesis unit 22 synthesizes the MSB data and LSB data decoded by the PAM4 decoder 21 by using a bit MUX, and outputs the result of the synthesis to the first synchronization unit 23 and the second synchronization unit 27.

The first synchronization unit 23, the first SKP filter unit 24, the processing unit 25, and the first scramble analysis unit 26 are circuits compatible with PCIe Gen1-5.

The first synchronization unit 23 includes an 8b/10b synchronization unit and a 128b/130b synchronization unit. The 8b/10b synchronization unit finds a Comma pattern of PCIe Gen1-2 from the data synthesized by the bit synthesis unit 22, performs symbol synchronization in 10-bit alignment, aligns input data at a symbol boundary, and outputs the result of the alignment. Here, the Comma pattern is configured by 7 bits of Comma+(0011111) or Comma−(1100000). The Comma pattern is a single pattern when consecutive 7 bits in the pattern after 8b/10b encoding is viewed. The Comma pattern does not appear so long as there is no bit error, and thus the Comma pattern is used to find 10-bit alignment. Further, the 128b/130b synchronization unit finds the EIEOS pattern of PCIe Gen3-5 from the data synthesized by the bit synthesis unit 22, performs symbol synchronization in 130-bit block alignment, aligns input data at a symbol boundary, and outputs the result of the alignment.

The first SKP filter unit 24 specifies the SKP of PCIe Gen1-5 from an input bit string from the first synchronization unit 23, and removes the SKP from the input bit string.

The processing unit 25 is configured to include an 8b/10b decoder, a 128b/130b decoder, a Precoding decoder, a delay circuit, and a selection circuit. The 8b/10b decoder is a decoder that performs 8b/10b code conversion used in PCIe Gen1-2, and converts an input bit string of 10-bit symbols from which the SKP is removed by the first SKP filter unit 24 into 8-bit symbols. Further, the 128b/130b decoder is a decoder that performs 128b/130b code conversion used in PCIe Gen3-5, and converts an input bit string of 130-bit symbols from which the SKP is removed by the first SKP filter unit 24 into 128-bit symbols. The Precoding decoder is a decoder for removing PCIe Gen5 Precoding in data decoded by the 128b/130b decoder. The delay circuit has the same amount of delay as the processing time of the Precoding decoder, and outputs the data from the 128b/130b decoder in the same phase as the Precoding decoder. The selection circuit selects the output of either the Precoding decoder or the delay circuit in accordance with an instruction from the LTSSM 36.

The first scramble analysis unit 26 includes a descrambler for removing scrambling applied in PCIe Gen1-2 to the data from the processing unit 25, and a descrambler for removing the scrambling applied in PCIe Gen3-5.

When an EIEOS pattern of PCIe Gen6 is found from the data synthesized by the bit synthesis unit 22, the second synchronization unit 27 performs 1b/1b symbol synchronization in 8-bit alignment, aligns input data at a symbol boundary, and outputs the result of the alignment.

The second SKP filter unit 28 specifies the SKP of PCIe Gen6 from an input bit string from the second synchronization unit 27, and removes the SKP from the input bit string.

The Precoding decoder 29 is a decoder for removing PCIe Gen6 Precoding on the input bit string from which the SKP has been removed by the second SKP filter unit 28.

The first delay unit 30 has the same amount of delay as the processing time of the Precoding decoder 29, and outputs the data from the second SKP filter unit 28 in the same phase as the Precoding decoder 29.

The first selection unit 31 selects the output of either the Precoding decoder 29 or the first delay unit 30 in accordance with an instruction from the LTSSM 36.

The Graycoding decoder 32 is a decoder for removing PCIe Gen6 Graycoding on the input bit string selected by the first selection unit 31.

The second delay unit 33 has the same amount of delay as the processing time of the Graycoding decoder 32, and outputs the input bit string selected by the first selection unit 31 in the same phase as the Graycoding decoder 32.

The second selection unit 34 selects the output of either the Graycoding decoder 32 or the second delay unit 33 in accordance with an instruction from the LTSSM 36.

The second scramble analysis unit 35 is a descrambler for removing scrambling applied in PCIe Gen6 to the data selected by the second selection unit 34.

The LTSSM 36 is a state machine for analyzing TO (output only from the second scramble analysis unit 35), TS1 and TS2 training sequences, idle symbols, and idle Flit from the first scramble analysis unit 26 and the second scramble analysis unit 35, and advancing an LTSSM value (internal state value) and the Link Speed. Further, the LTSSM 36 manages a transmission pattern by generating a transmission REQ for the pattern generator 3 and receiving a transmission ACK from the pattern generator 3.

The third selection unit 37 is a selector that selects any of input raw data from the second synchronization unit 27, data from the second SKP filter unit 28 after SKP removal, and decoded data from the second scramble analysis unit 35 after the SKP removal, that is, pieces of data obtained by removing Precoding, Graycoding, and scrambling. The third selection unit 37 performs selection in accordance with an instruction from the operation unit 2.

The bit division unit 38 divides the data selected and output by the third selection unit 37 into MSB data and LSB data by using bit DMUX, and outputs the MSB data and the LSB data to the third delay unit 42.

The synchronization pattern detection unit 39 searches the data selected and output by the third selection unit 37 for a pattern that is the same as the pattern leading of the Flit pattern set by the operation unit 2, and outputs a pattern leading signal.

The reference pattern generation unit 40 uses the pattern leading signal from the synchronization pattern detection unit 39 as a trigger to generate an MSB reference pattern and an LSB reference pattern based on a Flit pattern (a pattern (including EIEOS and SKP) calculated by Expression (6)) according to the number of lanes set by the operation unit 2.

The symbol mask generation unit 41 uses the pattern leading signal from the synchronization pattern detection unit 39 as a trigger to generate a mask pattern in units of 1b/1b symbols, which is provided for determining whether the MSB data and the LSB data which are input patterns are distinguished from a Flit region or from an SKP region or an EIEOS region. The symbol mask generation unit 41 generates the mask pattern based on the mask pattern length and the mask pattern period, which are set by the operation unit 2. In addition, the symbol mask generation unit 41 outputs the mask pattern leading signal to the error detection unit 44.

Note that the Flit pattern of PCIe Gen6 is 1 FEC symbol=8 bits, and 1 FEC symbol is bit-interleaved with MSB data and LSB data, so it becomes a mask in units of 4 PAM 4 symbols. In the present embodiment, 0: Flit region and 1: EIEOS region and SKP region are assumed. The mask pattern corresponding to FIG. 5A is calculated in advance by a setting operation of the operation unit 2, and is set in an internal memory of the symbol mask generation unit 41. Note that, when the third selection unit 37 selects the data from the second SKP filter unit 28 after the SKP removal or the data from which the SKP from the second scramble analysis unit 35 is removed and the PCIe Gen6 coding is removed, the SKP has been removed from the data input to the error detection unit 44, and thus a pattern without a mask for the SKP region is set (a mask pattern for distinguishing the EIEOS region is set).

The third delay unit 42 delays the MSB data and the LSB data by a predetermined period and then inputs the delayed MSB data and LSB data to the error detection unit 44 so that the MSB data, the LSB data, the pattern leading signal, the MSB reference pattern, the LSB reference pattern, the mask pattern, and the mask pattern leading signal which are input to the error detection unit 44 have the same phase.

The fourth delay unit 43 delays the pattern leading signal by a predetermined period and then inputs the delayed pattern leading signal to the error detection unit 44 so that the MSB data, the LSB data, the pattern leading signal, the MSB reference pattern, the LSB reference pattern, the mask pattern, and the mask pattern leading signal which are input to the error detection unit 44 have the same phase.

The error detection unit 44 uses the MSB data and the LSB data according to the Flit pattern, the pattern leading signal, the MSB reference pattern, the LSB reference pattern, the mask pattern, and the mask pattern leading signal to detect and count a bit error (MSB bit error, LSB bit error), to detect and count a PAM4 symbol error, and to detect and count an FEC symbol error. Then, the error detection unit 44 outputs counting results to the operation unit 2.

Figure 6:
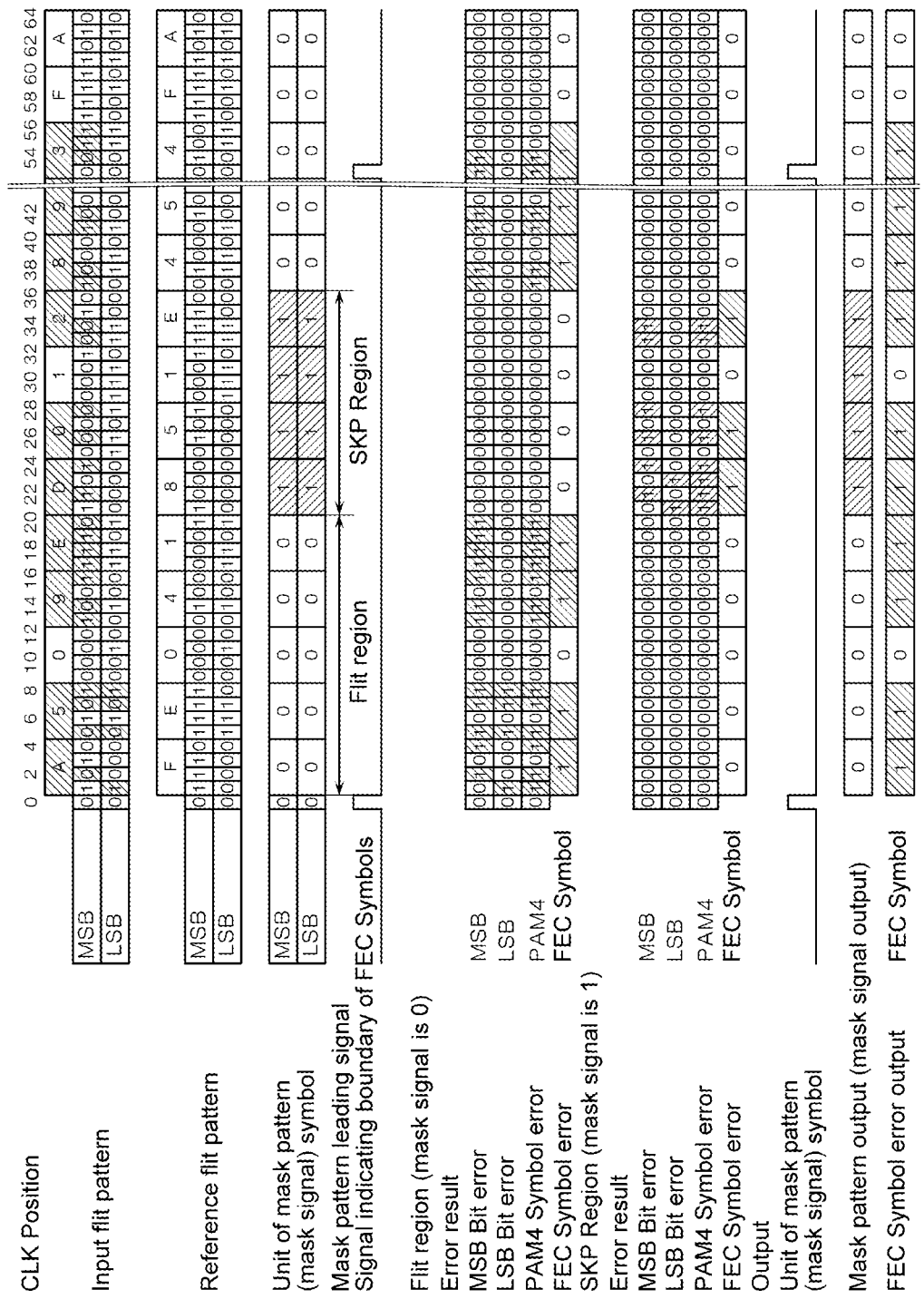
FIG. 6 is a diagram illustrating an example of a timing chart of various types of error detection in the error rate measurement apparatus according to the present invention.

Here, FIG. 6 illustrates an example of a timing chart of various types of error detection by the error detection unit 44 of the error rate measurement apparatus 1. FIG. 6 illustrates an example of a timing chart when a PAM4 signal based on bit string data of a Flit pattern is transmitted to the device under test W.

A case of focusing on CLK positions 1 to 36 after the input of the mask pattern leading signal in FIG. 6 will be described as an example. In this case, each bit of the MSB of the input Flit pattern (corresponding to the MSB data according to the Flit pattern): is compared with each corresponding bit of the MSB of the reference Flit pattern (corresponding to the MSB reference pattern). In addition, each bit of the LSB of the input Flit pattern (corresponding to the LSB data according to the Flit pattern) is compared with each corresponding bit of the LSB of the reference Flit pattern (corresponding to the LSB reference pattern).

As a result, the error results in the Flit region (mask signal is 0) are that the MSB bit error is "0", "1", "0", "1", "1", "0", "1", "1", "0", "0", "0", "0", "1", "1", "0", "1", "1", "1", "1", "1", the LSB bit error is "1", "0", "0", "0", "1", "0", "1", "1", "0", "0", "0", "0", "0", "0", "0", "0", "0", "0", "0", "0", the PAM4 symbol error is "1", "1", "0", "1", "1", "0", "1", "1", "0", "0", "0", "0", "1", "1", "0", "1", "1", "1", "1", "1", and the FEC symbol error is "1", "1", "0", "1", "1".

On the other hand, the error results in the EIEOS and the SKP region (mask signal is 1) are that the MSB bit error is "0", "1", "0", "1", "0", "1", "0", "1", "0", "0", "0", "0", "1", "1", "0", "0", the LSB bit error is "1", "0", "1", "0", "0", "0", "0", "0", "0", "0", "0", "0", "0", "0", "0", the PAM4 symbol error is "1", "1", "1", "1", "0", "1", "0", "1", "0", "0", "0", "0", "1", "1", "0", "0", and the FEC symbol error is "1", "1", "0", "1".

Note that the error detection unit 44 matches the phase of the mask pattern and the mask pattern leading signal inputted from the symbol mask generation unit 41 with the error detection result in units of FEC symbols, and outputs the result of matching to the Flit error detection unit 45 together with the error detection results in units of FEC symbols. Here, instead of the mask pattern leading from the symbol mask generation unit 41, the pattern leading signal from the fourth delay unit 43 may be used.

The Flit error detection unit 45 uses a mask pattern to detect and count FEC symbol errors in the Flit region (mask signal is 0), and the EIEOS and the SKP region (mask signal is 1).

In addition, the Flit error detection unit 45 detects and counts whether the number of FEC symbol errors in any ECC group exceeds an FEC symbol error threshold value set by the operation unit 2 in one Flit length, and outputs the counting result to the operation unit 2.

Note that capturing and the like can also be performed by using the detection result of the Flit error detection unit 45.

The synchronization state management unit 46 notifies the operation unit 2 of synchronization establishment, when the amount of errors in the portion corresponding to Flit falls below a synchronization condition threshold value based on error number information based on the error detection result of the error detection unit 44. Furthermore, when the amount of errors in the portion corresponding to Flit exceeds the synchronization condition threshold value based on the error number information based on the error detection result of the error detection unit 44, the synchronization state management unit 46 notifies the operation unit 2 of synchronization non-establishment and instructs the synchronization pattern detection unit 39 to reacquire the pattern leading of the Flit pattern (research for the pattern leading). Note that the notification destination of synchronization establishment or non-establishment is not limited to the operation unit 2. For example, an external terminal device may be used, and a user may be notified by message display, voice, or the like.

Next, the internal configuration of the Flit error detection unit 45 in FIG. 2 will be described with reference to FIG. 7.

Figure 7:
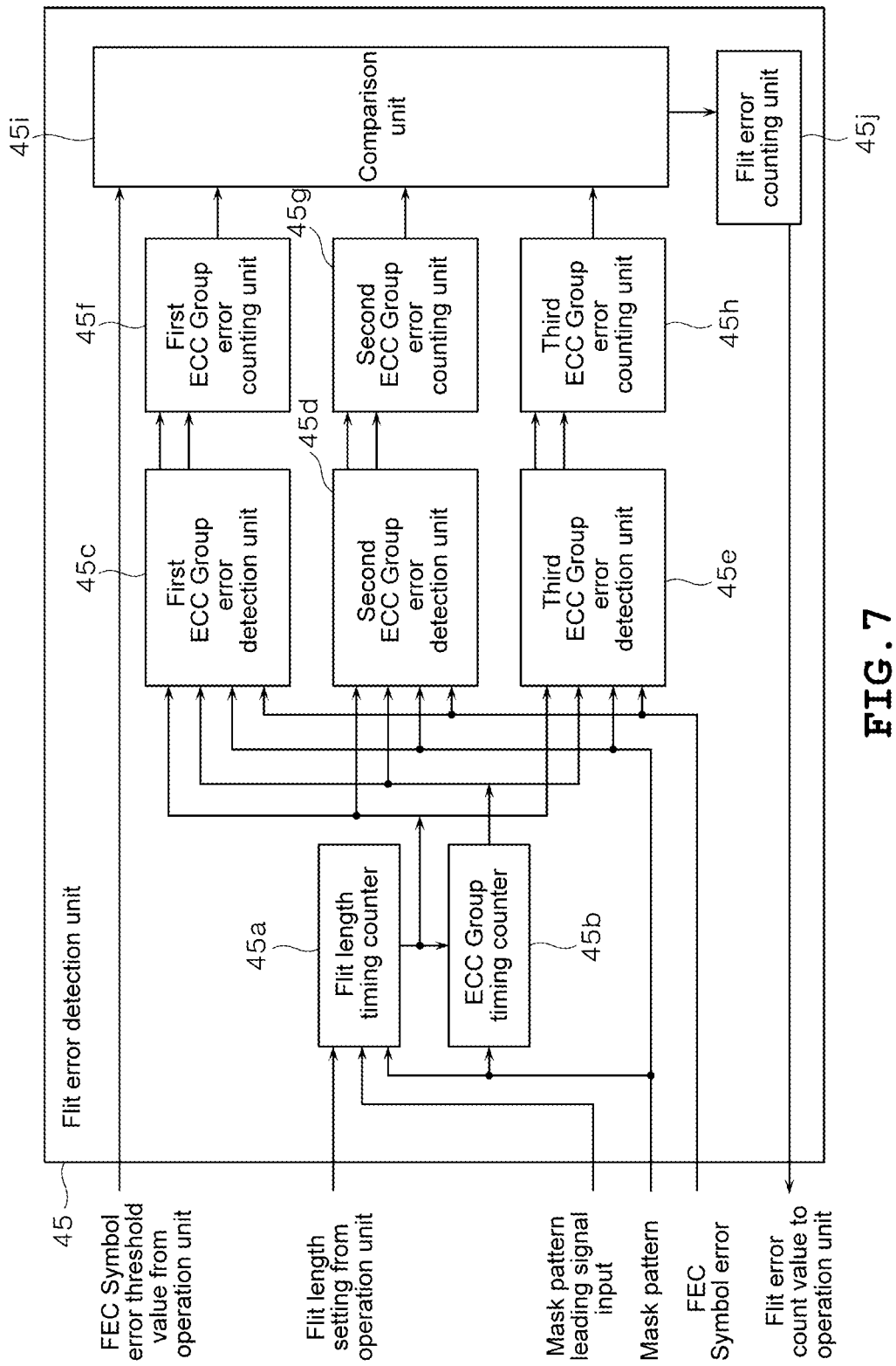
FIG. 7 is a block diagram illustrating an internal configuration of a Flit error detection unit in FIG. 2.

As illustrated in FIG. 7, the Flit error detection unit 45 is configured to include a Flit length timing counter 45a, an ECC Group timing counter 45b, a first ECC Group error detection unit 45c, a second ECC Group error detection unit 45d, a third ECC Group error detection unit 45e, a first ECC Group error counting unit 45f, a second ECC Group error counting unit 45g, a third ECC Group error counting unit 45h, a comparison unit 45i, and a Flit error counting unit 45j.

The Flit length timing counter 45a counts the Flit length set by the operation unit 2, by using the mask pattern leading signal as a trigger. The counter counts up when the mask pattern is in the Flit region (the mask signal is 0), and repeats counting from 0 when the value reaches the Flit length.

The ECC Group timing counter 45b is a counter used to distinguish between ECC Groups, and is a counter that outputs the remainder when a Flit length timing counter value is divided by 3.

The first ECC Group error detection unit 45c detects an FEC symbol error in which the counter value of the ECC Group timing counter 45b is 0 and the mask pattern is in the Flit region (the mask signal is 0).

The first ECC Group error counting unit 45f counts the number of FEC symbol errors detected by the first ECC Group error detection unit 45c in one Flit length section for each Flit length section.

The second ECC Group error detection unit 45d detects an FEC symbol error in which the counter value of the ECC Group timing counter 45b is 1 and the mask pattern is in the Flit region (the mask signal is 0).

The second ECC Group error counting unit 45g counts the number of FEC symbol errors detected by the second ECC Group error detection unit 45d in one Flit length section for each Flit length section.

The third ECC Group error detection unit 45e detects an FEC symbol error in which the counter value of the ECC Group timing counter 45b is 2 and the mask pattern is in the Flit region (the mask signal is 0).

The third ECC Group error counting unit 45h counts the number of FEC symbol errors detected by the third ECC Group error detection unit 45e in one Flit length section for each Flit length section.

The comparison unit 45i compares the number of FEC symbol errors in the one Flit length section with the FEC symbol error threshold value: n set by the operation unit 2. When there is an ECC group in which the number of FEC symbol errors in the one Flit length section exceeds the FEC symbol error threshold value: n, the comparison unit 45i outputs a Flit error detection signal to the Flit error counting unit 45j.

The Flit error counting unit 45j counts the Flit error detection signal from the comparison unit 45i, and outputs the counting result (Flit error count value) to the operation unit 2.

Figure 8:
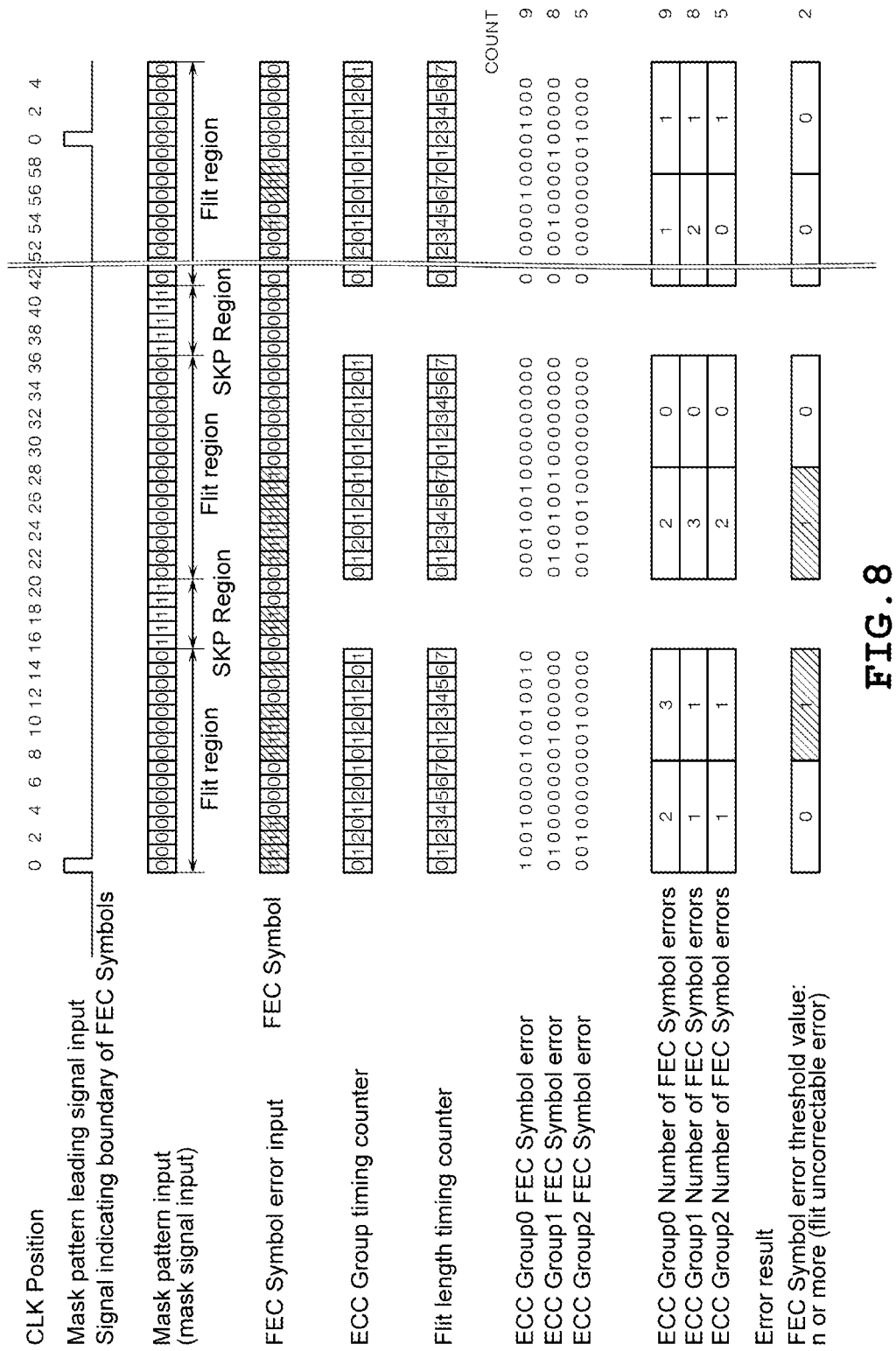
FIG. 8 is a diagram illustrating an example of a timing chart of FEC symbol error detection for each ECC group in the error rate measurement apparatus according to the present invention.

Here, FIG. 8 illustrates an example of a timing chart of FEC symbol error detection for each ECC Group by the Flit error detection unit 45 of the error rate measurement apparatus 1. In this example, it is assumed that the Flit length is set to 8 symbols and the FEC symbol error threshold value n is set to 3 symbols.

Focusing on the Flit region of CLK positions 0 to 15 in FIG. 8, "1", "1", "1", "1", "0", "0", "0", "0", "1", "1", "1", "1", "0", "0", "1", "0", are input as the FEC symbol errors. In the Flit region, for every 4 PAM4 symbols=8 bits, the number of FEC symbol errors in ECC Group 0 is "2", "3", the number of FEC symbol errors in ECC Group 1 is "1", "1", and the number of FEC symbol errors in ECC Group 2 is "1", "1". In the Flit region of CLK positions 8 to 15, the number of FEC symbol errors in ECC Group 0 is "3", and is equal to or more than the FEC symbol error threshold value: n="3". Thus, Flit error 1 is output as the error result.

Note that CLK positions 16 to 20 and 37 to 41 in the SKP region in FIG. 8 are masked by the mask pattern, and thus error detection and counting are not performed.

Figure 9:
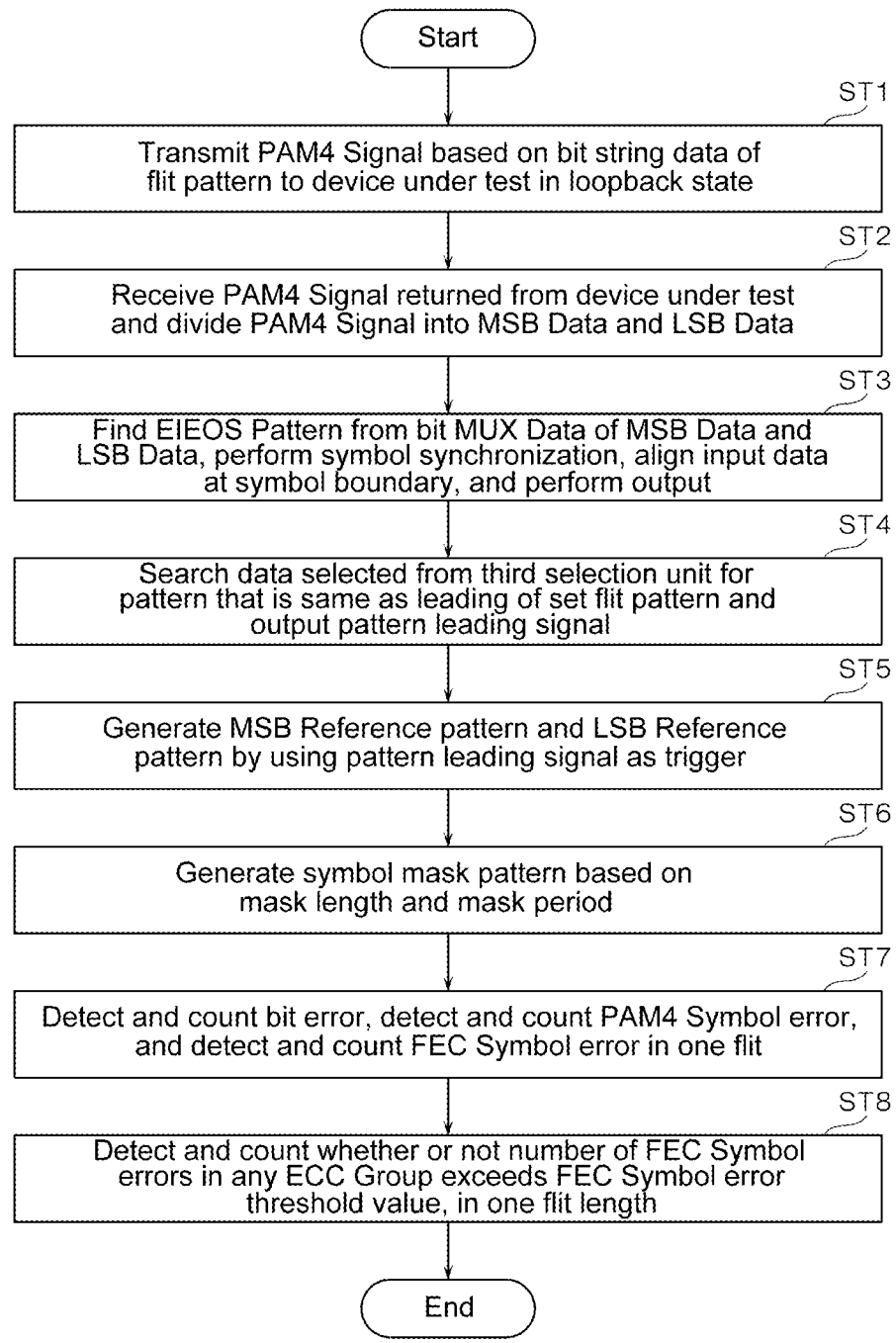
FIG. 9 is a flowchart of processing operations of the error rate measurement apparatus according to the present invention.

Next, processing operations when errors in the PCIe Gen6 physical layer are measured by the error rate measurement apparatus 1 having the above configuration will be described with reference to the flowchart of FIG. 9. Note that it is assumed that, when error measurement in the PCIe Gen6 physical layer is performed, the error rate measurement apparatus 1 operates normally up to PCIe Gen1-5, and a device under test W has transitioned to the Gen6 loopback state by link training.

First, a PAM4 signal based on bit string data of the Flit is generated from the pattern generator 3 and transmitted to the device under test W in a Gen6 loopback state (ST1).

Then, the error detector 4 receives the PAM4 signal returned from the device under test W by transmission of the PAM4 signal from the pattern generator 3 to the device under test W, and divides the received PAM4 signal into MSB data and LSB data by the PAM4 decoder 21 (ST2). The MSB data and LSB data divided by the PAM4 decoder 21 are subjected to the bit MUX in the bit synthesis unit 22 and are output to the second synchronization unit 27.

When an EIEOS pattern of PCIe Gen6 is found from the data synthesized by the bit synthesis unit 22, the second synchronization unit 27 performs 1b/1b symbol synchronization in 8-bit alignment, aligns input data at a symbol boundary, and outputs the result of the alignment to the second SKP filter unit 28 and the third selection unit 37 (ST3).

Subsequently, the synchronization pattern detection unit 39 searches data (any of pieces of the data from the second synchronization unit 27, the data from the second SKP filter unit 28, and the data from the second scramble analysis unit 35) selected by the third selection unit 37 for a pattern that is the same as the pattern leading of the Flit pattern set by the operation unit 2. Then, the synchronization pattern detection unit 39 outputs a pattern leading signal (ST4).

Here, when data is selected by the third selection unit 37 described above, the following processes are executed. First, the second SKP filter unit 28 removes the SKP from the input bit string from the second synchronization unit 27 and outputs the result of removal to the Precoding decoder 29, the first delay unit 30, and the third selection unit 37. Then, the Precoding decoder 29 removes the PCIe Gen6 Precoding from the input bit string from which the SKP has been removed, and outputs the result of removal to the first selection unit 31. Further, the first delay unit 30 outputs the input bit string from the second SKP filter unit 28 to the first selection unit 31 in the same phase as the Precoding decoder 29. Then, in the first selection unit 31, the output of either the Precoding decoder 29 or the first delay unit 30 is selected in accordance with an instruction from the LTSSM 36, and is input to the Graycoding decoder 32 and the second delay unit 33.

Subsequently, the Graycoding decoder 32 removes the PCIe Gen6 Graycoding for the input bit string selected by the first selection unit 31 and outputs the result of removal to the second selection unit 34. Further, the second delay unit 33 outputs the input bit string from the first selection unit 31 to the second selection unit 34 in the same phase as the Graycoding decoder 32. Then, in the second selection unit 34, the output of either the Graycoding decoder 32 or the second delay unit 33 is selected in accordance with an instruction from the LTSSM 36, and is input to the second scramble analysis unit 35. Further, the second scramble analysis unit 35 removes the scrambling applied in PCIe Gen6 from the data selected by the second selection unit 34 and outputs the result of removal to the LTSSM 36 and the third selection unit 37.

Then, the reference pattern generation unit 40 uses the pattern leading signal from the synchronization pattern detection unit 39 as a trigger to generate an MSB reference pattern and an LSB reference pattern based on the pattern obtained by Expression (6) (ST5).

Furthermore, the symbol mask generation unit 41 uses the pattern leading signal from the synchronization pattern detection unit 39 as a trigger to generate a symbol mask pattern based on the mask pattern length and the mask pattern period set by the operation unit 2 (ST6).

Then, the error detection unit 44 uses the MSB data and the LSB data according to the Flit pattern, the pattern leading signal, the MSB reference pattern, the LSB reference pattern, the mask pattern, and the mask pattern leading signal to detect and count a bit error, to detect and count a PAM4 symbol error, and to detect and count an FEC symbol error (ST7). The counting result at this time is output to the operation unit 2. At this time, when the amount of errors in the portion corresponding to Flit, which are detected by the error detection unit 44, falls below the synchronization condition threshold value, the operation unit 2 is notified of the synchronization establishment from the synchronization state management unit 46. On the other hand, when the amount of errors in the portion corresponding to Flit, which are detected by the error detection unit 44, exceeds the synchronization condition threshold value, the operation unit 2 is notified of the synchronization non-establishment from the synchronization state management unit 46, and the synchronization pattern detection unit 39 is instructed to reacquire the pattern leading of the Flit pattern (research for the pattern leading).

In addition, the Flit error detection unit 45 detects and counts whether the number of FEC symbol errors in any ECC group exceeds an FEC symbol error threshold value set by the operation unit 2 in one Flit length (ST8). The counting result at this time is output to the operation unit 2.

As described above, according to the present embodiment, it is possible to use the same Flit pattern as in the L0 state without bringing a device under test into the L0 state, and to accurately ascertain the relationship between a bit error and a Flit error. Moreover, since error correction is not performed, it is possible to reduce the circuit size.

Further, even in an environment where patterns guarded by FEC and patterns not guarded by FEC are present together, it is possible to identify the pattern guarded by FEC and determine whether the pattern is Uncorrectable.

Furthermore, the data in which an error is measured can be selected from the input raw data, the data after the SKP removal, and the data from which the SKP has been removed and PCIe Gen6 code has been removed. Thus, it is possible to accurately ascertain situations in which a bit error and a Flit error caused by PCIe Gen6 coding have occurred.

In addition, even when the error rate is high and the SKP removal is difficult, by enabling selection of the method of masking a bit error in the SKP portion, it is possible to exclude the SKP from the measurement target.

Hitherto, the best mode of the error rate measurement apparatus and the error rate measurement method according to the present invention has been described above, but the present invention is not limited by the description and drawings according to this mode. That is, other modes, embodiments, operation techniques, and the like made by the persons skilled in the art based on this mode are all included in the scope of the present invention.

DESCRIPTION OF REFERENCE NUMERALS AND SIGNS

1 Error rate measurement apparatus
2 Operation unit

3 Pattern generator
4 Error detector
11 First selection unit
12 First sequence generation unit
13 Second sequence generation unit
14 Measurement pattern generation unit
15 First encoder
16 Second encoder
17 Second selection unit
18 Bit division unit
19 PAM4 Encoder
21 PAM4 Decoder
22 Bit synthesis unit
23 First synchronization unit
24 First SKP Filter unit
25 Processing unit
26 First scramble analysis unit
27 Second synchronization unit
28 Second SKP Filter unit
29 Precoding decoder
30 First delay unit
31 First selection unit
32 Graycoding decoder
33 Second delay unit
34 Second selection unit
35 Second scramble analysis unit
36 LTSSM
37 Third selection unit
38 Bit division unit
39 Synchronization pattern detection unit
40 Reference pattern generation unit
41 Symbol mask generation unit
42 Third delay unit
43 Fourth delay unit
44 Error detection unit
45 Flit error detection unit
45a Flit length timing counter
45b ECC Group timing counter
45c First ECC Group error detection unit
45d Second ECC Group error detection unit
45e Third ECC Group error detection unit
45f First ECC Group error counting unit
45g Second ECC Group error counting unit
45h Third ECC Group error counting unit
45i Comparison unit
45j Flit error counting unit
46 Synchronization state management unit
W Device under test

What is claimed is:

1. An error rate measurement apparatus comprising:
an operation unit that performs a setting; and
an error detector that receives a pulse amplitude modulation 4 (PAM4) signal based on bit string data of a Flit pattern transmitted from a device under test and that detects an error, wherein
the operation unit sets one period of the Flit pattern including an electrical idle exit ordered set (EIEOS) according to the number of lanes defined in a high-speed bus standard, and a skip ordered set (SKP OS), a Flit length according to the number of lanes, a threshold value for determining a Flit error, an insertion period of the EIEOS, a pattern leading of the Flit pattern, and a synchronization condition threshold value,
the error rate measurement apparatus further comprises a pattern generator that generates the PAM4 signal based on bit string data of the Flit pattern and transmits the generated PAM4 signal to the device under test in a loopback state, and
the error detector includes
an error detection unit that detects and counts an error in a portion corresponding to Flit by excluding, from a measurement target, a portion corresponding to the EIEOS and the SKP OS in the PAM4 signal received from the device under test in the loopback state,
a Flit error detection unit that detects a forward error correction (FEC) symbol error in the portion corresponding to the Flit for each error correction code (ECC) group, counts the number of FEC symbol errors, and determines an ECC group in which the number of FEC symbol errors exceeds the threshold value, to be the Flit error, and
a synchronization state management unit that gives an instruction to reacquire the pattern leading of the Flit pattern when an amount of the error in the portion corresponding to the Flit, which is detected by the error detection unit, exceeds the synchronization condition threshold value.

2. The error rate measurement apparatus according to claim 1, wherein
when the portion corresponding to the SKP OS is excluded from the measurement target, the operation unit selects and sets whether to mask a bit error in the corresponding portion or to filter and remove the SKP OS itself.

3. The error rate measurement apparatus according to claim 1, further comprising:
a selection unit that selects and sets whether or not to decode the portion corresponding to the Flit according to the high-speed bus standard.

4. The error rate measurement apparatus according to claim 1, wherein
link training is performed with the device under test, and
a link training and status state machine (LTSSM) of the device under test is transitioned to the loopback state.

5. An error rate measurement apparatus comprising:
an operation unit that performs a setting; and
an error detector that receives a pulse amplitude modulation 4 (PAM4) signal based on bit string data of a Flit pattern transmitted from a device under test and that detects an error, wherein
the operation unit sets one period of the Flit pattern including an electrical idle exit ordered set (EIEOS) according to the number of lanes defined in a high-speed bus standard, and a skip ordered set (SKP OS), a Flit length according to the number of lanes, a threshold value for determining a Flit error, an insertion period of the EIEOS, a pattern leading of the Flit pattern, and a synchronization condition threshold value,
the error rate measurement apparatus further comprises a pattern generator that generates the PAM4 signal based on bit string data of the Flit pattern and transmits the generated PAM4 signal to the device under test in a loopback state,
the error detector includes
an error detection unit that detects and counts an error in a portion corresponding to Flit by excluding, from a measurement target, a portion corresponding to the EIEOS and the SKP OS in the PAM4 signal received from the device under test in the loopback state,
a Flit error detection unit that detects a forward error correction (FEC) symbol error in the portion corresponding to the Flit for each error correction code (ECC) group, counts the number of FEC symbol errors, and determines an ECC group in which the number of FEC symbol errors exceeds the threshold value, to be the Flit error, and
a synchronization state management unit that gives an instruction to reacquire the pattern leading of the Flit pattern when an amount of the error in the portion corresponding to the Flit, which is detected by the error detection unit, exceeds the synchronization condition threshold value,
when a portion corresponding to the SKP OS is excluded from the measurement target, the operation unit selects and sets whether to mask a bit error in the corresponding portion or to filter and remove the SKP OS itself,
the error rate measurement apparatus further comprises a selection unit that selects and sets whether or not to decode a portion corresponding to the Flit according to the high-speed bus standard,
link training is performed with the device under test, and a link training and status state machine (LTSSM) of the device under test is transitioned to the loopback state.

6. An error rate measurement method using an operation unit that performs a setting, and an error detector that receives a pulse amplitude modulation 4 (PAM4) signal based on bit string data of a Flit pattern transmitted from a device under test and that detects an error, wherein
in a step of, by the operation unit, performing the setting, one period of the Flit pattern including an electrical idle exit ordered set (EIEOS) according to the number of lanes defined in a high-speed bus standard, and a skip ordered set (SKP OS), a Flit length according to the number of lanes, a threshold value for determining a Flit error, an insertion period of the EIEOS, a pattern leading of the Flit pattern, and a synchronization condition threshold value are set,
the error rate measurement method comprises:
a step of, by a pattern generator, generating the PAM4 signal based on bit string data of the Flit pattern and transmitting the generated PAM4 signal to the device under test in a loopback state;
a step of, by an error detection unit of the error detector, detecting and counting an error in a portion corresponding to Flit by excluding, from a measurement target, a portion corresponding to the EIEOS and the SKP OS in the PAM4 signal received from the device under test in the loopback state;
a step of, by a Flit error detection unit of the error detector, detecting a forward error correction (FEC) symbol error in the portion corresponding to the Flit for each error correction code (ECC) group, counting the number of FEC symbol errors, and determining an ECC group in which the number of FEC symbol errors exceeds the threshold value, to be the Flit error; and
a step of, by a synchronization state management unit of the error detector, giving an instruction to reacquire the pattern leading of the Flit pattern when an amount of the error in the portion corresponding to the Flit, which is detected by the error detection unit, exceeds the synchronization condition threshold value.

7. The error rate measurement method according to claim 6, further comprising:
a step of, by the operation unit, selecting and setting whether to mask a bit error in the corresponding portion or to filter and remove the SKP OS itself, when the portion corresponding to the SKP OS is excluded from the measurement target.

8. The error rate measurement method according to claim 6, further comprising:
a step of, by a selection unit, selecting and setting whether or not to decode the portion corresponding to the Flit according to the high-speed bus standard.

9. The error rate measurement method according to claim 6, further comprising:
a step of performing link training with the device under test, and causing a link training and status state machine (LTSSM) of the device under test to transition to the loopback state.

10. An error rate measurement method using an operation unit that performs a setting, and an error detector that receives a pulse amplitude modulation 4 (PAM4) signal based on bit string data of a Flit pattern transmitted from a device under test and that detects an error, wherein,
in a step of, by the operation unit, performing the setting, one period of the Flit pattern including an electrical idle exit ordered set (EIEOS) according to the number of lanes defined in a high-speed bus standard, and a skip ordered set (SKP OS), a Flit length according to the number of lanes, a threshold value for determining a Flit error, an insertion period of the EIEOS, a pattern leading of the Flit pattern, and a synchronization condition threshold value are set,
the error rate measurement method comprises:
a step of, by a pattern generator, generating the PAM4 signal based on bit string data of the Flit pattern and transmitting the generated PAM4 signal to the device under test in a loopback state;
a step of, by an error detection unit of the error detector, detecting and counting an error in a portion corresponding to Flit by excluding, from a measurement target, a portion corresponding to the EIEOS and the SKP OS in the PAM4 signal received from the device under test in the loopback state;
a step of, by a Flit error detection unit of the error detector, detecting a forward error correction (FEC) symbol error in the portion corresponding to the Flit for each error correction code (ECC) group, counting the number of FEC symbol errors, and determining an ECC group in which the number of FEC symbol errors exceeds the threshold value, to be the Flit error;
a step of, by a synchronization state management unit of the error detector, giving an instruction to reacquire the pattern leading of the Flit pattern when an amount of the error in the portion corresponding to the Flit, which is detected by the error detection unit, exceeds the synchronization condition threshold value;
a step of, by the operation unit, selecting and setting whether to mask a bit error in the corresponding portion or to filter and remove the SKP OS itself, when a portion corresponding to the SKP OS is excluded from the measurement target;
a step of, by a selection unit, selecting and setting whether or not to decode a portion corresponding to the Flit according to the high-speed bus standard; and
a step of performing link training with the device under test, and causing a link training and status state machine (LTSSM) of the device under test to transition to the loopback state.

\* \* \* \* \*